United States Patent
Hata et al.

(10) Patent No.: US 7,904,765 B2
(45) Date of Patent: Mar. 8, 2011

(54) TEST APPARATUS AND TEST METHOD

(75) Inventors: Masahiko Hata, Tokyo (JP); Shinya Sato, Tokyo (JP)

(73) Assignee: Advantest Corporation, Tokyo (JP)

(*) Notice: Subject to any disclaimer, the term of this patent is extended or adjusted under 35 U.S.C. 154(b) by 511 days.

(21) Appl. No.: 11/857,449

(22) Filed: Sep. 19, 2007

(65) Prior Publication Data
US 2008/0229162 A1  Sep. 18, 2008

Related U.S. Application Data

(63) Continuation of application No. PCT/JP2006/309053, filed on Apr. 28, 2006.

(30) Foreign Application Priority Data

May 13, 2005  (JP) .................................. 2005-140622

(51) Int. Cl.
*G11C 29/38* (2006.01)
*G11C 29/50* (2006.01)
(52) U.S. Cl. ........................................ 714/718; 714/724
(58) Field of Classification Search ........................ None
See application file for complete search history.

(56) References Cited

U.S. PATENT DOCUMENTS

| | | | | |
|---|---|---|---|---|
| 6,204,681 B1 | * | 3/2001 | Nagatsuka et al. | 324/761 |
| 7,096,396 B2 | * | 8/2006 | Uesaka et al. | 714/725 |
| 2003/0016045 A1 | * | 1/2003 | Tanimura et al. | 324/765 |

FOREIGN PATENT DOCUMENTS

| | | | |
|---|---|---|---|
| JP | 07-130200 | * | 5/1995 |
| JP | 2003-240828 | | 8/2003 |
| JP | 2005122490 A | * | 5/2005 |

OTHER PUBLICATIONS

Chinese Preliminary Notice of First Office Action dated Mar. 23, 2010, issued for the related Patent Application No. 095116499, and English translation thereof, 18 pages.

* cited by examiner

*Primary Examiner* — Robert Beausoliel
*Assistant Examiner* — Dipakkumar Gandhi
(74) *Attorney, Agent, or Firm* — Osha • Liang LLP

(57) ABSTRACT

Provided is a test apparatus including: test signal supply sections supplying a test signal writing test data to the connected memory under test, to a terminal of the memory; terminal correspondence determination sections outputting a terminal unit determination result indicating whether test data from the connected terminal matches an expected value; a determination result selection section selecting, for each memory, terminal unit determination results from the terminal correspondence determination sections; a memory correspondence determination section determining whether writing succeeded to each memory, based on the selection result by the determination result selection section; an identifying section identifying a test signal supply section connected to the memory to which writing succeeded and a test signal supply section connected to the memory to which writing failed; and a mask treatment section instructing each test signal supply section whether to perform re-testing, according to whether writing succeeded.

16 Claims, 7 Drawing Sheets

TEST APPARATUS AND TEST METHOD

CROSS REFERENCE TO RELATED APPLICATION

This is a continuation application of PCT/JP2006/309053 filed on Apr. 28, 2006, which claims priority from a Japanese Patent Application(s) No. 2005-140622 filed on May 13, 2005, the contents of which are incorporated herein by reference.

BACKGROUND

1. Technical Field

The present invention relates to a test apparatus and a test method. In particular, the present invention relates to a test apparatus and a test method for efficiently connecting and testing a plurality of devices under test.

2. Related Art

A semiconductor memory test apparatus connects a plurality of semiconductor memories, which are to be devices under test (DUT:device under test), and tests these semiconductor memories in parallel. Such a test apparatus includes pin resources, corresponding to terminals of the devices under test, and input and output a signal with respect to the terminals.

For example, a NOR-type flash memory includes an address input terminal, a control input terminal, a data input/output terminal, and a state output terminal. As an example, a NOR-type flash memory, which has a configuration of 16 M×16 bits, has 24 address input terminals, 7 control input terminals, 16 data input/output terminals, and one state output terminal. A conventional test apparatus includes a predetermined number of driver pin resources outputting a signal and a predetermined number of IO common pin resources inputting and outputting a signal, and assigns the driver pin resources to the address input terminals and to the control input terminals, and assigns the IO common pin resources to the data input/output terminals and to the state output terminal.

In addition, when testing a plurality of flash memories, when writing to a part of the flash memories has failed, it becomes necessary for a test apparatus to perform another writing to the flash memories to which writing has been failed, and to determine whether the writing was successful. Here, since there is a limitation in the number of writing to a flash memory, a test apparatus masks another writing to flash memories to which writing has succeeded, as is disclosed in Japanese Patent Application Publication No. 1995 (H3)-130200. In this way, when testing a plurality of devices under test, it is necessary for a test apparatus to enable control of the entire pin resources by classifying them for each device under test.

In view of this, in a conventional test apparatus, it becomes possible to assign the pin resources as a whole to each device under test, according to several kinds of predetermined division patterns. For example, when using 384 pin resources, the following division patterns have been selectable:

(1) Simultaneous Test of Four Devises Under Test $1^{st}$ to $96^{th}$ pin resources are assigned to a device under test 1, $97^{th}$ to $192^{nd}$ pin resources are assigned to a device under test 2, and $193^{rd}$ to $288^{th}$ pin resources are assigned to a device under test 3, and $289^{th}$ to $384^{th}$ pin resources are assigned to a device under test 4.

(2) Simultaneous Test of Eight Devices Under Test $1^{st}$ to $48^{th}$ pin resources are assigned to the device under test 1, and $49^{th}$ to $96^{th}$ pin resources are assigned to the device under test 2, ..., and $337^{th}$ to $384^{th}$ pin resources are assigned to the device under test 8.

(3) Simultaneous Test of 16 Devices Under Test $1^{st}$ to 24 pin resources are assigned to the device under test 1, and $25^{th}$ to $48^{th}$ pin resources are assigned to the device under test 2, ..., and $361^{st}$ to $384^{th}$ pin resources are assigned to the device under test 16.

Recently, in response to the trend that the portable telephones, digital AV devices, IC cards, and so on are endowed with higher functions, semiconductor devices are becoming of higher integration. In addition, MCP (multi chip package) where a plurality of semiconductor memories and logics are installed in a single package is becoming common. Such a semiconductor device has a different number of terminals according to applications, and further has a different ratio between the number of input terminals to be connected to the driver pin resources and the number of input/output terminals to be connected to the IO common pin resources.

A general NAND-type flash memory receives an address using data input/output terminals. As one example, a NAND-type flash memory of 256M×16bits has 6 control input terminals, 16 data input/output terminals, and one state output terminal. Accordingly, when testing the NAND-type flash memory, the ratio between the required number of driver pin resources and IO common pin resources will be different from the corresponding ratio for a NOR-type flash memory.

A conventional test apparatus can only divide pin resources according to a predetermined division pattern, and that the number of the driver pin resources and the number of IO common pin resources included in each divided set of pin resources are also predetermined. Accordingly, depending on a device under test, there may be cases where pin resources cannot be assigned efficiently and many pin resources remain as redundant.

For example, when a device under test has 50 pins in the above example, 8 division that only assigns 48 pins for each device under test cannot be used, and 4 division is to be used. In this case, 96 pins are assigned for each device under test, and so 46 pins remain as redundant.

Moreover, for example when there is shortage in IO common pin resources included in a divided set of pin resources, it becomes necessary to reduce the number of devices under test that can be subjected to a simultaneous test even if the number of driver pin resource is sufficient.

SUMMARY

In view of this, it is an object of one aspect of the present invention to provide a test apparatus and a test method that are capable of solving the foregoing problems. This object is achieved by combinations of features described in the independent claims. The dependent claims define further advantageous and concrete examples of the present invention.

According to an aspect related to the innovations herein, one exemplary test apparatus includes: a plurality of test signal supply sections, each of which is connected to a corresponding terminal of a corresponding one of the memories under test, and supplies a test signal for writing test data to the memory under test to which the test signal supply section is connected, to the terminal; a plurality of terminal correspondence determination sections, each of which is connected to a corresponding terminal of a corresponding one of the memories under test, and outputs a terminal unit determination result indicating whether test data read from the terminal being the connection destination matches an expected value or not; a determination-side connection information memorizing section that memorizes determination-side connection information that associates each of the terminal correspondence determination sections to a corresponding one of the memories under test being the connection destination; and a determination result treatment section that determines whether writing to each of the memories under test succeeded or not based on a plurality of terminal unit determination results collected from the plurality of terminal correspondence determination sections and the determination-side connection information, and causes the plurality of test signal supply sections to re-test memories under test to which writing failed.

According to an aspect related to the innovations herein, one exemplary test method includes: supplying a test signal for writing test data to the memories under test, to a terminal of one of the memories under test, outputting a terminal unit determination result indicating whether test data read from a terminal of one of the memories under test matches an expected value or not; memorizing determination-side connection information that associates each of a plurality of members outputting the terminal unit determination result, to a memory under test being the connection destination; and collecting the terminal unit determination results from the plurality of members outputting the terminal unit determination results, determining whether writing to each of the memories under test succeeded or not based on the plurality of terminal unit determination results and the determination-side connection information, and re-testing memories under test to which writing failed.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
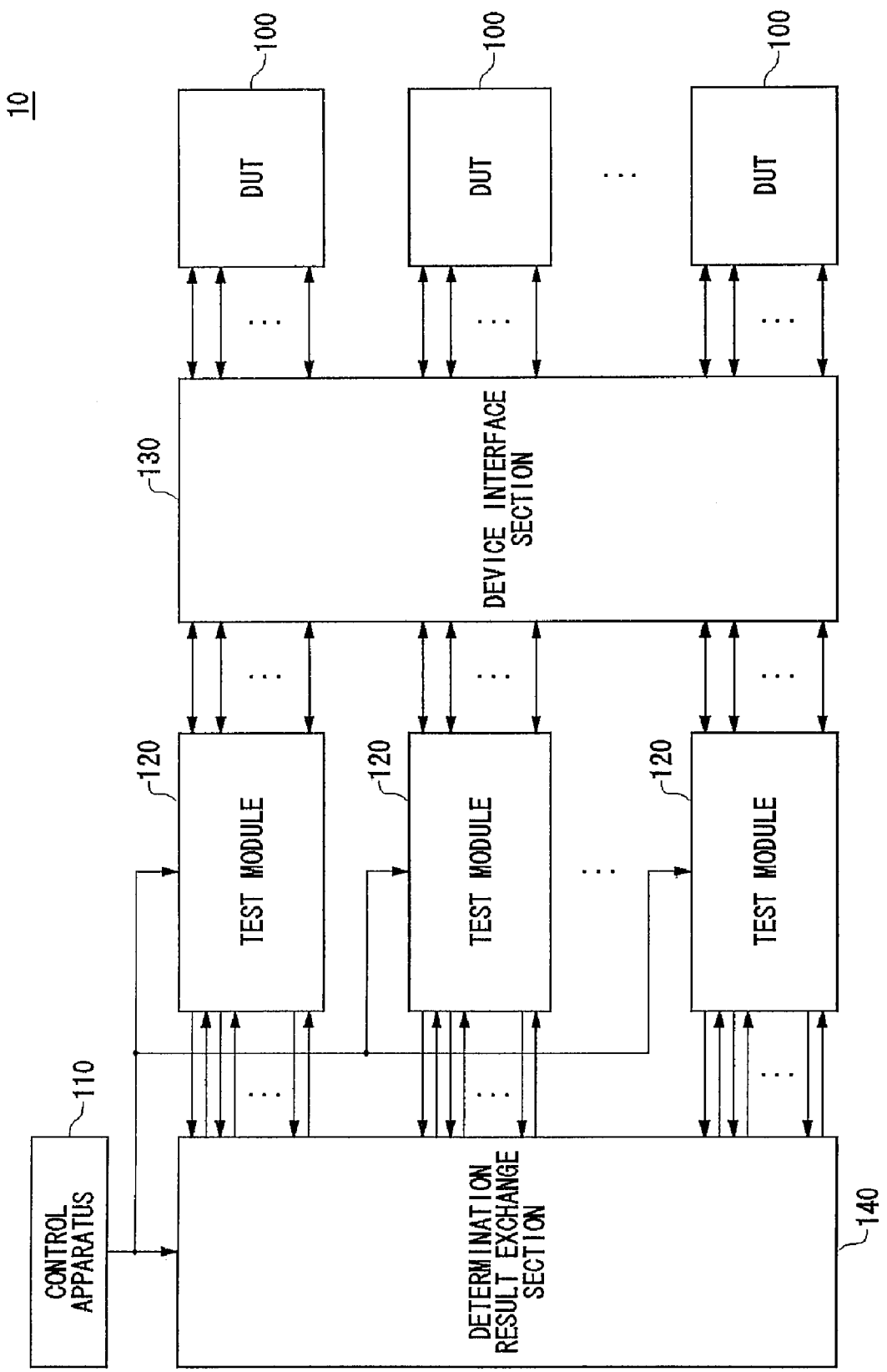
FIG. 1 shows a configuration of a test apparatus 10 according to an embodiment of the present invention.

FIG. 1 shows a configuration of a test apparatus 10 according to the present embodiment. The test apparatus 10 tests a plurality of DUTs 100 in parallel. As one example, a DUT 100 is a memory under test such as an MCP device in which a flash memory or a memory is installed. The test apparatus 10 according to the present embodiment realizes higher degree of freedom for connection between a plurality of test modules 120 and a plurality of DUTs 100, thereby efficiently assigning pin resources.

The test apparatus 10 includes a control apparatus 110, one or a plurality of test modules 120, a device interface section 130, and a determination result exchange section 140. The control apparatus 110 controls the test modules 120 and the determination result exchange section 140, thereby performing a test of the plurality of DUTs 100. A test module 120 includes a plurality of pin resources. A test module 120 supplies, using each pin resource, a test signal to a DUT 100 to which the test module 120 is connected, and determines whether the DUT 100 passes or fails the test, according to an output signal outputted from the DUT in response to the test signal. A test module 120 according to the present embodiment provides high degree of freedom in connection relation with a DUT 100. To be more specific, each test module 120 may be connected to two or more DUTs 100. Alternatively, two or more test modules 120 may be connected to the same DUT 100.

The device interface section 130 connects the plurality of test modules 120 to the plurality of DUTs 100. Since the test apparatus 10 according to the present embodiment realizes high degree of freedom in connection relation between the test modules 120 and the DUTs 100, the device interface section 130 may be configured to connect a terminal of a test module 120 located in the most appropriate position, to a terminal of a DUT 100.

The determination result exchange section 140 is connected to the plurality of test modules 120, thereby collecting determination results resulting from determination according to each pin resource in each test module 120. Then the determination result exchange section 140 determines, for each DUT 100, whether the DUT 100 passed or failed the test, and determines whether to perform re-testing for the DUT 100.

Figure 2:
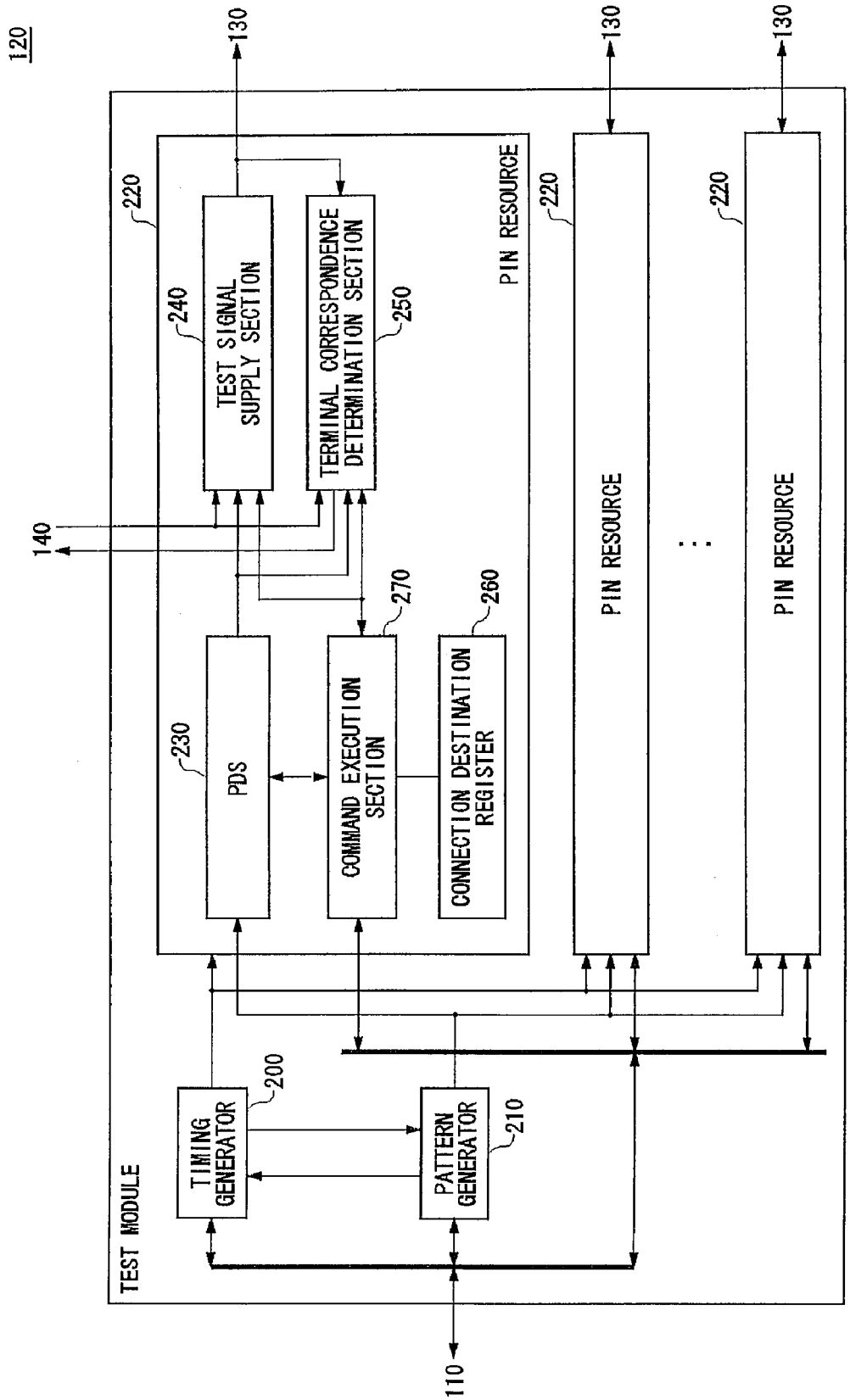
FIG. 2 shows a configuration of a test module 120 according to an embodiment of the present invention.

FIG. 2 shows a configuration of a test module 120 according to the present embodiment. The test module 120 includes a timing generator 200, a pattern generator 210, and a plurality of pin resources 220. In response to an instruction from the pattern generator 210, the timing generator 200 generates a cyclic clock indicating each execution cycle of a test program, from a reference clock functioning as a reference of operation of the test apparatus 10, and supplies the cyclic clock to the pattern generator 210. In addition, the timing generator 200 generates a timing at which a test signal based on a test pattern is supplied to a DUT 100, for each test cycle.

The pattern generator 210 executes a sequence of test programs designated by a user of the test apparatus 10, and generates a test pattern to be supplied to a DUT 100 for each test cycle designed by the cyclic clock. In addition, the pattern generator 210 generates an expected value pattern of an output signal outputted from the DUT 100, and supplies the expected value pattern to each pin resource 220. The pattern generator 210 may include an ALPG (algorithmic pattern generator) that generates a test pattern that includes an address and data to be supplied to the DUT 100 according to a pre-set algorithm.

Each of the plurality of pin resources 220 are connected to a corresponding terminal of a corresponding DUT 100, supplies a test signal to the terminal to which the pin resource 220 is connected, and/or receives an output signal outputted from the terminal to which the pin resource 220 is connected, and compares the output signal with the expected value. A pin resource 220 includes a PDS 230, a test signal supply section 240, a terminal correspondence determination section 250, a connection destination register 260, and a command execution section 270. By adopting such a configuration, all test signal supply sections 240 and all terminal correspondence determination sections 250 included in the test apparatus 10 will be implemented by being divided into a plurality of test modules 120 that respectively have two or more test signal supply sections 240 and two or more terminal correspondence determination sections 250.

A PDS 230 (pattern data selector) selects a command bit, an address bit, or a data bit, which correspond to the terminal to which the pin resource 220 that includes the PDS 230 is connected, from among the test patterns and/or the expected value patterns generated by the pattern generator 210. The test signal supply section 240 receives a test pattern from the pattern generator 210, and forms a test signal waveform that is based on a timing received from the timing generator 200. Then the test signal supply section 240 supplies a test signal to the terminal of the DUT 100 to which the pin resource 220 is connected. More specifically, the plurality of test signal supply sections 240 supply a test signal as shown in the following, when testing the memory function of the DUTs 100.

First, each of the plurality of test signal supply sections 240 supplies a test signal for writing test data to the DUT 100 to which the test signal supply section 240 is connected, to the DUT 100 to which the test signal supply section 240 is connected. Specifically, for writing the test data, the test signal supply section 240 connected to the address input terminal of the DUT 100 outputs, as a test signal, an address bit selected by the PDS 230 from the write address of the test data, to the DUT 100. In addition, for writing the test data, the test signal supply section 240 connected to the data input/output terminal of the DUT 100 outputs, as a test signal, a data bit selected by the PDS 230 from the test data, to the DUT 100. When a DUT 100 has such a specification that receives an address from a data input/output terminal, for the purpose of writing the test data, the test signal supply section 240 may output, as a test signal, an address bit selected by the PDS 230 from the write address of an address cycle, to the DUT 100. In addition, for writing the test data, the test signal supply section 240 connected to the control input terminal of a DUT 100 outputs, as a test signal, a command bit selected by the PDS 230 from the command for writing the test data, to the DUT 100.

Next, each of the plurality of test signal supply sections 240 supplies a test signal for reading the test data written in the above way from the DUT 100 connected to the test signal supply section 240, to the terminal of the DUT 100 to which the test signal supply section 240 is connected. Specifically, for reading the test data, the test signal supply section 240 connected to the address input terminal of the DUT 100 outputs, as a test signal, an address bit selected by the PDS 230 from the read address of the test data, to the DUT 100. In addition, for reading the test data, the test signal supply section 240 connected to the control input terminal of the DUT 100 outputs, as a test signal, a command bit selected by the PDS 230 from the command for reading the test data, to the DUT 100.

The terminal correspondence determination section 250 determines whether the output signal outputted from a terminal of the DUT 100 being the connection destination matches the expected value received from the pattern generator 210 via the PDS 230. Specifically, when the terminal is a data input/output terminal, the terminal correspondence determination section 250 determines whether the test data read from the terminal matches the expected value, and outputs a terminal unit determination result indicating the determination result of the terminal, to the determination result exchange section 140. As one example, when the test data matches the expected value, the terminal correspondence determination section 250 outputs a terminal unit determination result of the logical value L indicating that the DUT 100 has passed the test, and when the test data does not match the expected value, the terminal correspondence determination section 250 outputs a terminal unit determination result of the logical value H indicating that the DUT 100 has failed the test.

A connection destination register 260 is provided in correspondence with a test signal supply section 240 and a terminal correspondence determination section 250 of a pin resource 220, and memorizes memory identification information identifying the DUT 100 connected to the test signal supply section 240 and the terminal correspondence determination section 250 of the pin resource 220, and terminal identification information identifying the terminal of the DUT 100 being the connection destination. As an example, the test apparatus 10 according to the present embodiment identifies a plurality of DUTs 100 to be tested, by sequentially assigned numbers (e.g. $1^{st}$, $2^{nd}$, ..., $X^{th}$, etc.). Then the connection destination register 260 memorizes the number identifying the DUT 100 to which the pin resource 220 that includes the connection destination register 260 is connected. In addition, the test apparatus 10 according to the present embodiment identifies, for each DUT 100, the plurality of terminals included in the DUT 100, by the sequentially assigned numbers (e.g. $1^{st}$, $2^{nd}$, ... $Y^{th}$, etc.). Then the connection destination register 260 memorizes the number identifying the terminal to which the pin resource 220 that includes the connection destination register 260 is connected.

The command execution section 270 is provided in correspondence with the PDS 230, the test signal supply section 240, and the terminal correspondence determination section 250 of the pin resource 220. When receiving the command directed to the pin resource 220 from the control apparatus 110, the command execution section 270 executes the command. As one example, the control apparatus 110 transmits a write command, a read command, and so on directed to the register in any of the pin resources 220, to the plurality of test signal supply sections 240 through broadcasting. When receiving a command broadcasted by the control apparatus 110, each command execution section 270 executes the command, on condition that the memory identification information and the terminal identification information designated by the command match the memory identification information and the terminal identification information memorized in the connection destination register 260. According to this, by pre-storing the identification information of the DUT 100 and of the terminal in the connection destination register 260, each pin resource 220 becomes able to adequately issue a command by broadcasting, even when each pin resource 220 is connected to any terminal of any DUT 100.

Figure 3:
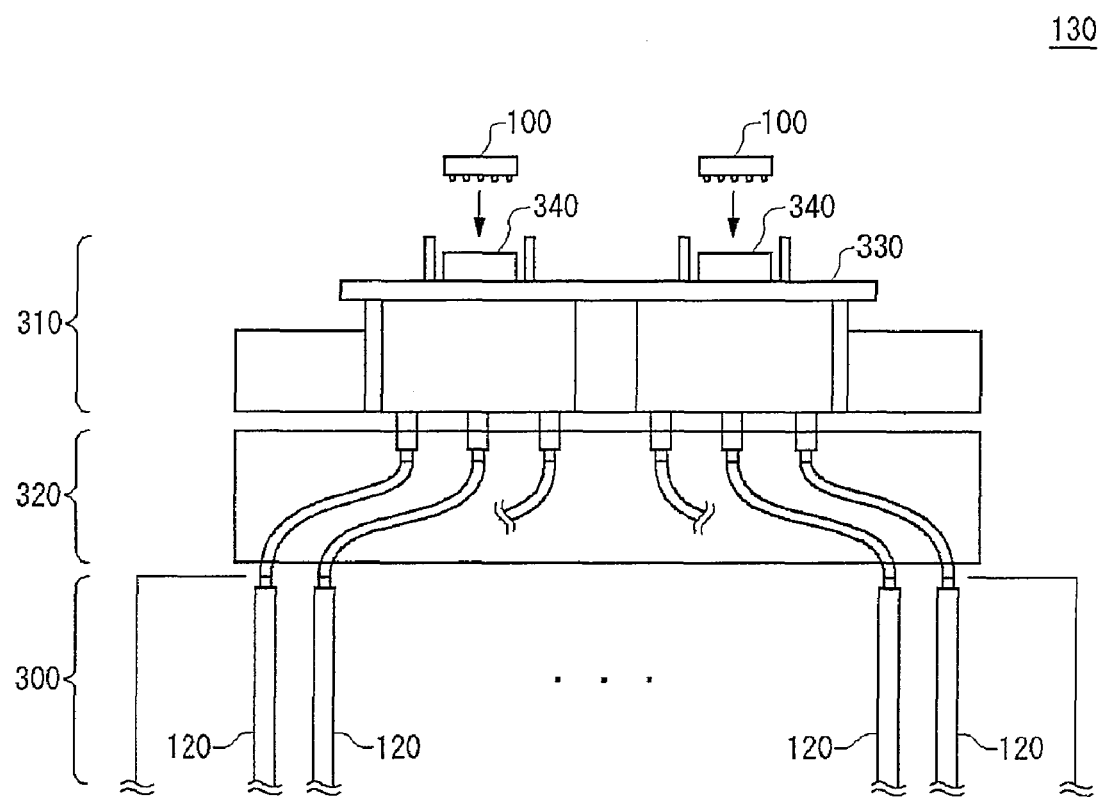
FIG. 3 shows a configuration of a device interface section 130 according to an embodiment of the present invention.

FIG. 3 shows a configuration of a device interface section 130 according to the present embodiment. The device interface section 130 includes a DSA (device substitution adapter) section 310 and an MB (mother board) section 320, and is mounted on the test head 300 in which the plurality of test modules 120 are incorporated.

The DSA section 310 is a type exchange section manufactured in correspondence with the type of a DUT 100, and includes a plurality of sockets 340 and a socket board 330. A DUT 100 is mounted to a socket 340, and the socket 340 electrically connects each terminal of the DUT 100 to wiring on the socket board 330. The socket board 330 is provided to electrically connect each terminal of the plurality of sockets 340 and a plurality of connectors (first connectors) that connects the DSA section 310 to the MB section 320, by means of the wiring on the substrate. According to this arrangement, the socket board 330 guides the wiring from each terminal of each socket 340, to the first connector in a suitable position for connection to the test head 300. Here, each socket 340 and each first connector may not be in one-to-one correspondence with each other.

The DSA section 310 is mounted to the MB section 320, and the MB section 320 is connected to the plurality of first connectors of the DSA section 310 by means of a plurality of second connectors. The MB section 320 electrically connects the plurality of second connectors and the plurality of test modules 120, by means of a cable such as a coaxial cable. According to this arrangement, the MB section 320 electrically connects the DSA section 310 and the plurality of test modules 120.

In the test apparatus 10 according to the present embodiment, wiring according to each type of DUT 100 is performed within the DSA section 310 if possible, and the MB section 320 is shared among a plurality of types whenever possible. Specifically, the MB section 320 is used common to tests of a plurality of kinds of DUTs 100 which differ in the terminal arrays from each other. On the other hand, the DSA section 310 that includes the socket board 330 is manufactured for each kind of DUT 100, and is exchanged according to the kind of the DUT 100.

In a conventional test apparatus 10, the terminal of the DUT 100 to be connected to each of the test modules 120 is determined to be almost fixed. For this reason, it is not possible to draw suitable wiring if only with the DSA section 310, and it has become necessary to exchange the MB section 320 according to types. As opposed to this, the test apparatus 10 according to the present embodiment is able to decide, with high degree of freedom, to which pin resource 220 of which test module 120 the terminal of each DUT 100 should be connected. Therefore, it is possible to select a pin resource 220 in a suitable position for the DSA section 310. Accordingly, it becomes possible to enable as many types as possible to share an MB section 320, according to the test apparatus 10 according to the present embodiment.

Furthermore, in a conventional test apparatus 10, each test module 120 has included a predetermined number of driver pin resources and IO common pin resources respectively. For this reason, there have been cases where either type of the pin resources remains as redundant, depending on the ratio between the number of the input terminals and the number of (input)/output terminals, thereby hindering efficient assignment of pin resources. As opposed to this, in the present embodiment, each test module 120 adopts a configuration of having more IO common pin resources in number instead of reducing the number of driver pin resources. As one example, the test module 120 may adopt such a configuration that there is no driver pin resource, and all the pin resources 220 are IO common pin resources. By adopting this configuration, the test apparatus 10 according to the present embodiment realizes effective utilization of the pin resources 220 in each test module 120, without generating redundant pin resources 220, and so can test as many DUTs 100 as possible.

Figure 4:
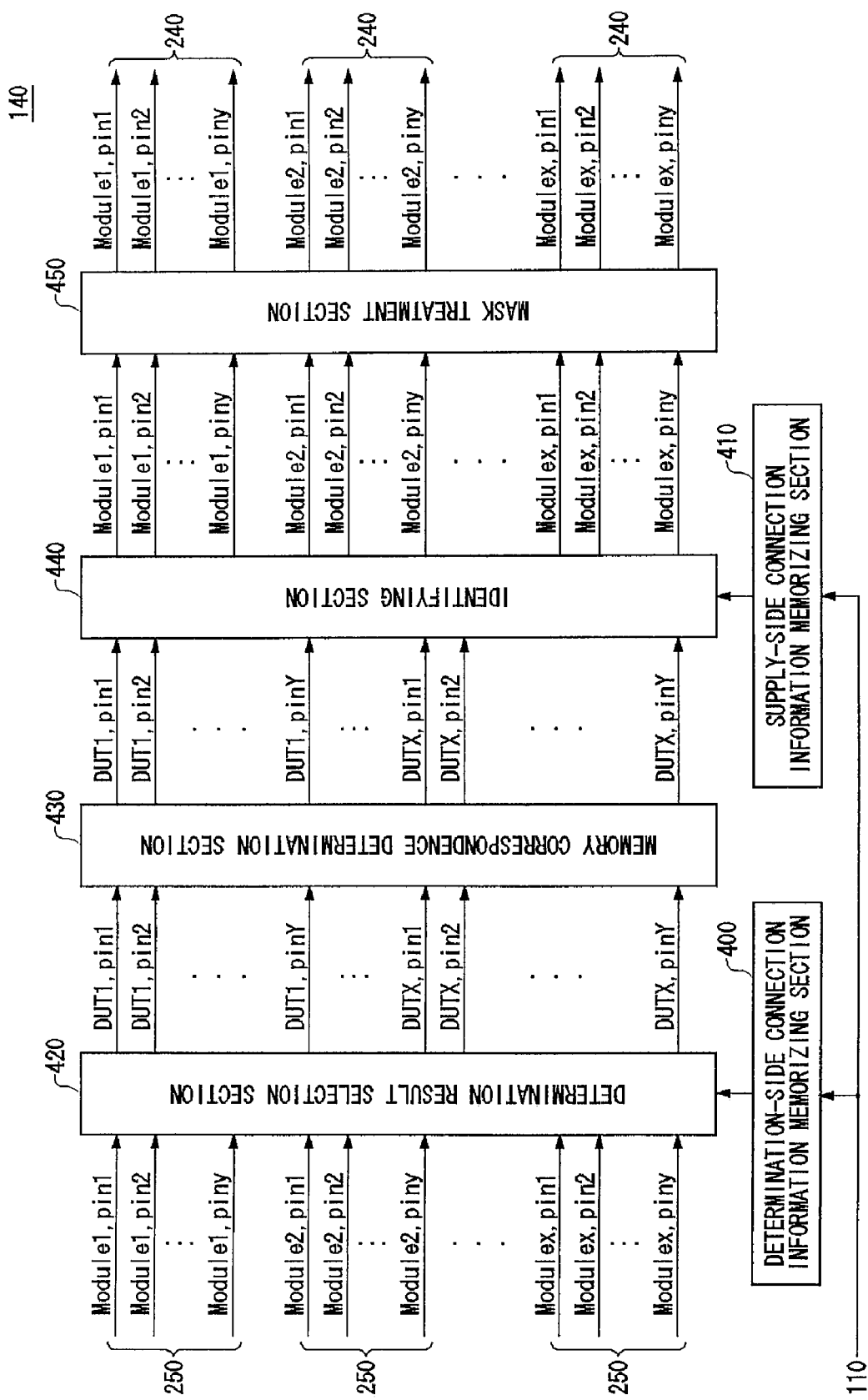
FIG. 4 shows a configuration of a determination result exchange section 140 according to an embodiment of the present invention.

FIG. 4 shows a configuration of the determination result exchange section 140 according to the present embodiment. The determination result exchange section 140 includes a determination-side connection information memorizing section 400, a supply-side connection information memorizing section 410, a determination result selection section 420, a memory correspondence determination section 430, an identifying section 440, and a mask treatment section 450. For each of the plurality of pin resources 220, the determination-side connection information memorizing section 400 memorizes the determination-side connection information that indicates the connection destination of the terminal correspondence determination section 250 of the pin resource 220. In the present embodiment, the determination-side connection information memorizing section 400 memorizes, as the determination-side connection information, information for associating each terminal correspondence determination section 250 to the DUT 100 to which the terminal correspondence determination section 250 is connected. In addition, the determination-side connection information memorizing section 400 may further memorize, as the determination-side connection information, information for associating each terminal correspondence determination section 250 to the terminal of the DUT 100 being the connection destination.

When the DSA section 310 that includes the socket board 330 is exchanged for changing the type of the DUT 100 to be tested, the control apparatus 110 writes determination-side connection information for use after the exchange, to the determination-side connection information memorizing section 400. This determination-side connection information takes a value for associating each terminal correspondence determination section 250 to the DUT 100 to which the terminal correspondence determination section 250 is connected via the DSA section 310 that is after the exchange and via the MB section 320 not exchanged. Here, the determination-side connection information may associate two or more terminal correspondence determination sections 250, each of which is included in a different test module 120 from each other, with the same DUT 100 to which the two or more terminal correspondence determination sections 250 are connected via the exchanged DSA section 310 and via the MB section 320.

The supply-side connection information memorizing section 410 memorizes, for each of the DUTs 100, supply-side connection information that indicates the test signal supply section 240 connected to the DUT 100. In the present embodiment, the supply-side connection information memorizing section 410, as the supply-side connection information, memorizes information associating each DUT 100 to the test signal supply section 240 that is to be connected to the DUT 100. Here, the supply-side connection information memorizing section 410, as the supply-side connection information, may memorize information associating each terminal of each DUT 100 to the test signal supply section 240 that is to be connected to the terminal.

When the DSA section 310 having the socket board 330 is exchanged for changing the kind of the DUT 100 to be tested, the control apparatus 110 writes supply-side connection information for use after the exchange, to the supply-side connection information memorizing section 410. This supply-side connection information takes a value for associating each test signal supply section 240 to the DUT 100 to which the test signal supply section 240 is connected via the DSA section 310 that is after the exchange and via the MB section 320 not exchanged. Here, the supply-side connection information may associate two or more test signal supply sections 240, each of which is included in a different test module 120 from each other, with the same DUT 100 to which the two or more test signal supply sections 240 are connected via the exchanged DSA section 310 and the MB section 320.

The determination result selection section 420, the memory correspondence determination section 430, the identifying section 440, and the mask treatment section 450 function as a determination result treatment section. The determination result treatment section determines whether writing to each DUT 100 succeeded or not, based on the plurality of terminal unit determination results collected from the plurality of terminal correspondence determination sections 250 and the determination-side connection information. Then the determination result treatment section subjects the DUT 100 to which writing failed, to re-testing by means of the plurality of test signal supply sections 240.

The determination result selection section 420 receives the plurality of terminal unit determination results outputted from the plurality of terminal correspondence determination sections 250 as a result of the writing test. Here, the plurality of terminal unit determination results received by the determination result selection section 420 are aligned in the order in which the test signal supply sections 240 are arranged. The determination result selection section 420 selects the plurality of terminal unit determination results outputted from the plurality of terminal correspondence determination sections 250, for each DUT 100, based on the determination-side connection information. More specifically, the determination result selection section 420 rearranges the order of the plurality of terminal unit determination results outputted from the plurality of terminal correspondence determination sections 250, in the order corresponding to the plurality of terminals of the plurality of DUTs 100.

As one example, the determination-side connection information memorizing section 400 memorizes, for each terminal of each DUT 100, the determination-side connection information identifying the terminal correspondence determination section 250 connected to the terminal. Specifically, the determination-side connection information memorizing section 400 memorizes, in correspondence with the $1^{st}$ terminal of the $1^{st}$ DUT 100, information identifying the pin resource 220 connected to the terminal, and memorizes, in correspondence with all the terminals of all the DUTs 100, information identifying the pin resources 220 connected to the terminals, in the similar manner. Then the determination result selection section 420 rearranges the plurality of terminal unit determination results, by selecting, in the order starting from the $1^{st}$ terminal of the $1^{st}$ DUT 100, the terminal unit determination result received from the pin resource 220 associated with the terminal, from among all the terminal unit determination results.

The memory correspondence determination section 430 determines whether writing to each DUT 100 succeeded or not, based on the selection result of the determination result selection section 420. The memory correspondence determination section 430 according to the present embodiment determines, for each DUT 100, determines whether writing to the DUT 100 succeeded or not, based on the terminal unit determination results having been rearranged by the determination result selection section 420. More specifically, for each DUT 100, when any of the terminal unit determination results having been rearranged indicates non-matching, the memory correspondence determination section 430 converts all the terminal unit determination results for the DUT 100 into a determination result indicating non-matching. According to this, the memory correspondence determination section 430 converts a plurality of terminal unit determination results into a plurality of pieces of writing successful/unsuccessful information corresponding to a plurality of terminals.

For example, when receiving a terminal unit determination result of the logical value L in passing of a test, and receiving a terminal unit determination result of the logical value H in failure of the test, the memory correspondence determination section 430 may take logical OR of the plurality of terminal unit determination results for each DUT 100, to use the result as the writing successful/unsuccessful information for each terminal of the DUT 100. According to this, when the terminal unit determination result of any terminal is the logical value H, the memory correspondence determination section 430 is able to set the writing successful/unsuccessful information of all the terminals of the DUT 100 to the logical value H indicating failure of writing.

The identifying section 440 identifies the test signal supply section 240 connected to the DUT 100 to which writing succeeded, and the test signal supply section 240 connected to the DUT 100 to which writing failed, based on the supply-side connection information memorized in the supply-side connection information memorizing section 410. The identifying section 440 according to the present embodiment, based on the supply-side connection information, associates a plurality of pieces of writing successful/unsuccessful information corresponding to the plurality of terminals to the plurality of test signal supply sections 240, by changing the order of the plurality of pieces of writing successful/unsuccessful information in the order corresponding to the plurality of the test signal supply sections 240.

As one example, the supply-side connection information memorizing section 410 memorizes, for each test signal supply section 240, supply-side identification information identifying the terminal of the DUT 100 connected to the test signal supply section 240. Specifically, the supply-side connection information memorizing section 410 memorizes, in correspondence with the $1^{st}$ test signal supply section 240 of the $1^{st}$ test module 120, information identifying the terminal of the DUT 100 connected to the test signal supply section 240, and memories, in correspondence with all the test signal supply sections 240, information identifying the terminals of the DUTs 100 connected to the test signal supply sections 240, in the similar manner. Then the identifying section 440 rearranges the order of the plurality of pieces of writing successful/unsuccessful information in the order of the test signal supply sections 240, by selecting, in the order starting from the $1^{st}$ test signal supply section 240 of the $1^{st}$ test module 120, writing successful/unsuccessful information regarding the terminal of the DUT 100 associated with the test signal supply section 240, from among all the pieces of writing successful/unsuccessful information.

The mask treatment section 450 supplies the plurality of pieces of writing successful/unsuccessful information having been rearranged in the order of the test signal supply sections 240, to corresponding test signal supply sections 240. According to this, the mask treatment section 450 prohibits the test signal supply section 240 connected to the DUT 100 to which writing succeeded, from supplying a test signal for writing test data again to the DUT 100. In addition, the mask treatment section 450, along with this treatment, prohibits the terminal correspondence determination section 250 connected to the DUT 100 to which writing succeeded, from performing the matching determination between the data read from the terminal being the connection destination and the expected value.

On the other hand, the mask treatment section 450 instructs the test signal supply section 240 connected to the DUT 100 to which writing failed, to supply a test signal for writing the test data again to the DUT 100. In addition, the mask treatment section 450, along with this treatment, instructs the terminal correspondence determination section 250 connected to the DUT 100 to which writing failed, to perform the matching determination between the data read from the terminal being the connection destination and the expected value. According to this, the mask treatment section 450 is able to re-test the DUT 100 to which writing failed, while prohibiting the re-testing to the DUT 100 to which writing succeeded.

According to the determination result exchange section 140 recited above, a plurality of terminal unit determination results arranged in the order of the pin resources 220 are able to be re-arranged in the order of the terminals for each DUT 100, to determine whether writing succeeded or not for each DUT 100. Then the determination result exchange section 140 is able to designate whether re-testing is necessary for each pin resource 220, by using, as the writing successful/unsuccessful information of all the terminals of each DUT 100, information on whether writing was successful for each DUT 100. Accordingly, the test apparatus 10 is able to efficiently connect between the plurality of pin resources 220 of the plurality of test modules 120 and the plurality of terminals of the plurality of DUTs 100, in accordance with the physical positioning by the device interface section 130. Then the test apparatus 10 does not prevent the same DUT 100 from selecting two or more pin resources 220, each of which is included in a different test module 120 from each other, or connecting them.

Figure 5:
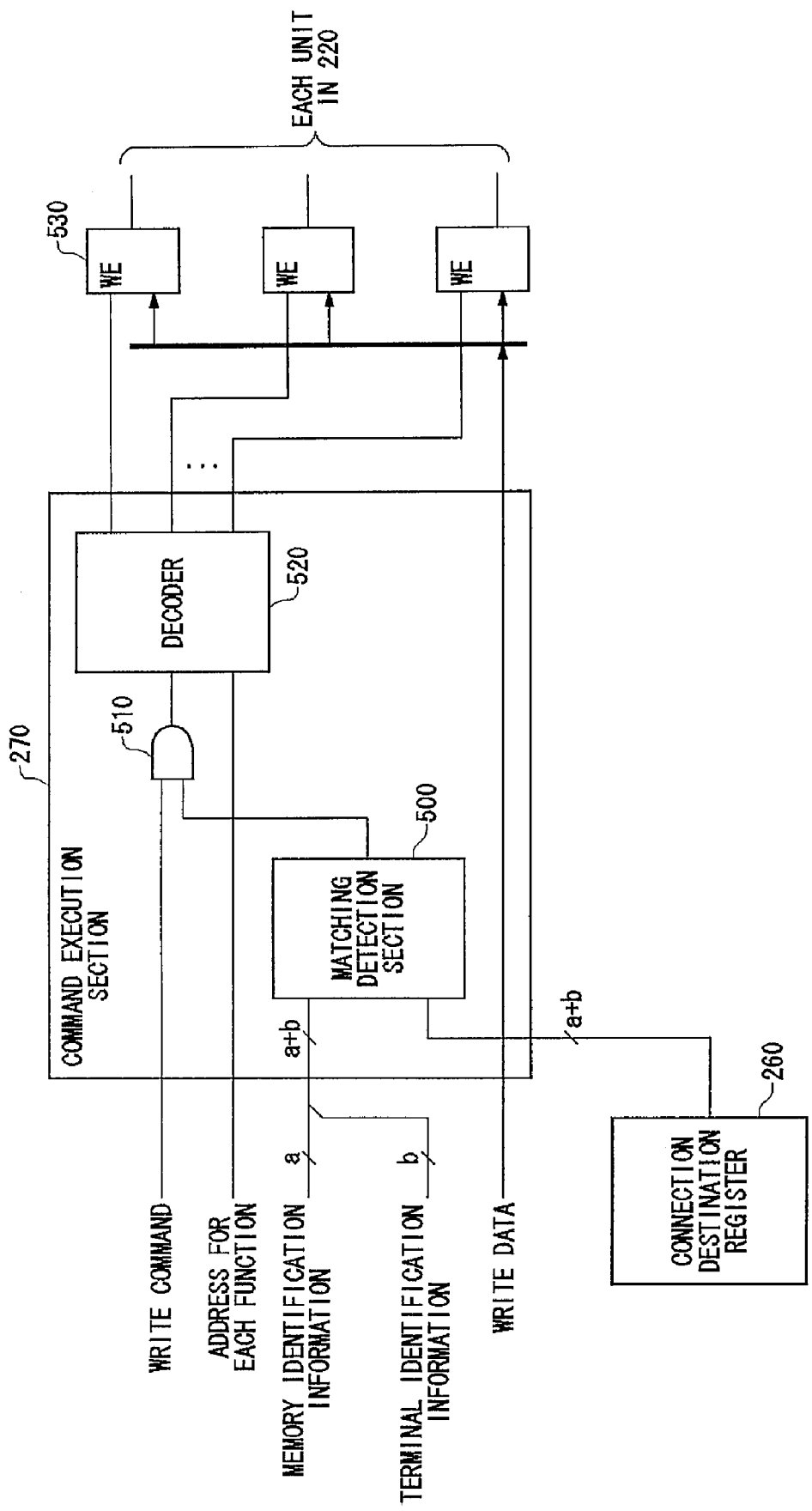
FIG. 5 shows one example of a configuration of a command execution section 270 according to an embodiment of the present invention.

FIG. 5 shows one example of a configuration of a command execution section 270 according to the present embodiment. The command execution section 270 executes a command issued from the control apparatus 110 with respect to the pin resource 220 that includes the command execution section 270. As one example, the command execution section 270 according to the present embodiment receives a write command with respect to each register 530 within a pin resource 220, and executes the write command.

The command execution section 270 includes a matching detection section 500, an AND gate 510, and a decoder 520. The matching detection section 500 receives memory identification information identifying the DUT 100 connected to the pin resource 220, and terminal identification information identifying the terminal of the DUT 100 being the connection destination, from the connection destination register 260. Then the matching detection section 500 detects whether the memory identification information and the terminal identification information designated by the command received from the control apparatus 110 match the memory identification information and the terminal identification information inputted from the connection destination register 260. The matching detection section 500 outputs the logical value H when they match, and the logical value L when they do not match, as the detection result.

The AND gate 510 takes a logical AND between the detection result by the matching detection section 500 and the writing effective bit that results in the logical value H when receiving a write command. According to this, the AND gate 510 outputs the logical value H when the write command has been issued and the writing is directed to the pin resource 220. The decoder 520 receives the output of the AND gate 510 and the address for each function which is the register address of the writing destination, and sets, to the logical value H, the write enable of the register 530 designated by the address for each function when the output of the AND gate 510 is the logical value H. According to this, the register 530 is able to store the write data designated by the write command.

According to the command execution section 270 recited above, it is possible to receive the memory identification information and the terminal identification information of the pin resource 220, from the connection destination register 260, and to select only the command directed to the pin resource 220 and execute the command. Accordingly, the control apparatus 110 is able to broadcast the command designated for each terminal of a DUT 100 in a test program, without identifying the pin resource 220 corresponding to the terminal.

Figure 6:
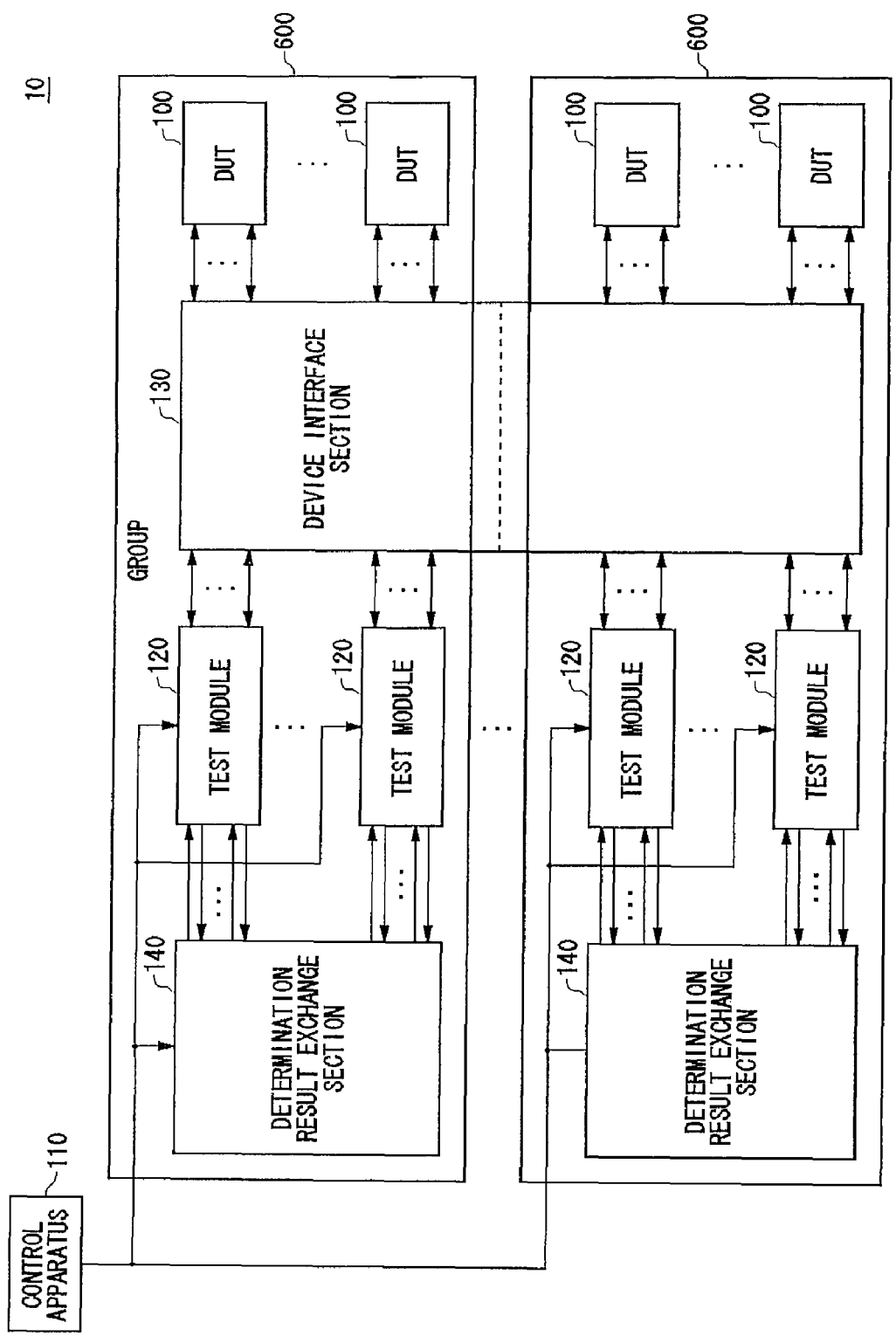
FIG. 6 shows a configuration of a test apparatus 10 according to a modification example according to an embodiment of the present invention.

FIG. 6 shows a configuration of a test apparatus 10 according to a modification example of the present embodiment. In FIG. 6, the members assigned the same reference numerals as in the members of FIG. 1 have the same function and configuration as the corresponding members in FIG. 1. Therefore, the detailed explanation is omitted except for the differences, in the following.

A test apparatus 10 according to the present modification example includes one or a plurality of test modules 120 and a determination result exchange section 140, for each group 600 resulting from dividing the plurality of DUTs 100 into two or more DUTs 100. Accordingly, the test apparatus 10 includes, for each group 600, two or more test signal supply sections 240 and terminal correspondence determination sections 250 associated with the group 600. Therefore, the test apparatus 10 includes a device interface section 130 that connects each of the plurality of DUTs 100 to the two or more test signal supply sections 240 and the two or more terminal correspondence determination sections 250 associated with the group 600 to which the DUT 100 belongs. Specifically, the device interface section 130 according to the present modification example connects, for each group 600, one or a plurality of test modules 120 belonging to the group 600 to the plurality of DUTs 100 belonging to the group 600. Every pin resource 220 adopts a configuration not connecting with a DUT 100 in the other groups 600.

According to this arrangement, the determination result exchange section 140 in each group 600 is able to suitably perform a test of all the DUTs 100, by adopting a configuration of receiving the terminal unit determination results in the group 600 and outputting the writing successful/unsuccessful information within the group 600. By adopting this configuration, the test apparatus 10 is able to realize connection by means of the device interface section 130 for each group 600 with high degree of freedom, while maintaining the number of input/output directed to each determination result exchange section 140 to an adequate number.

It should be noted here that each test module 120 and each determination result exchange section 140 stated above may be respectively realized by a separate semiconductor device. In this case, the number of pin resources 220 in a group 600 may be determined according to the number of terminals in the semiconductor device to which the determination result exchange section 140 is mounted.

Figure 7:
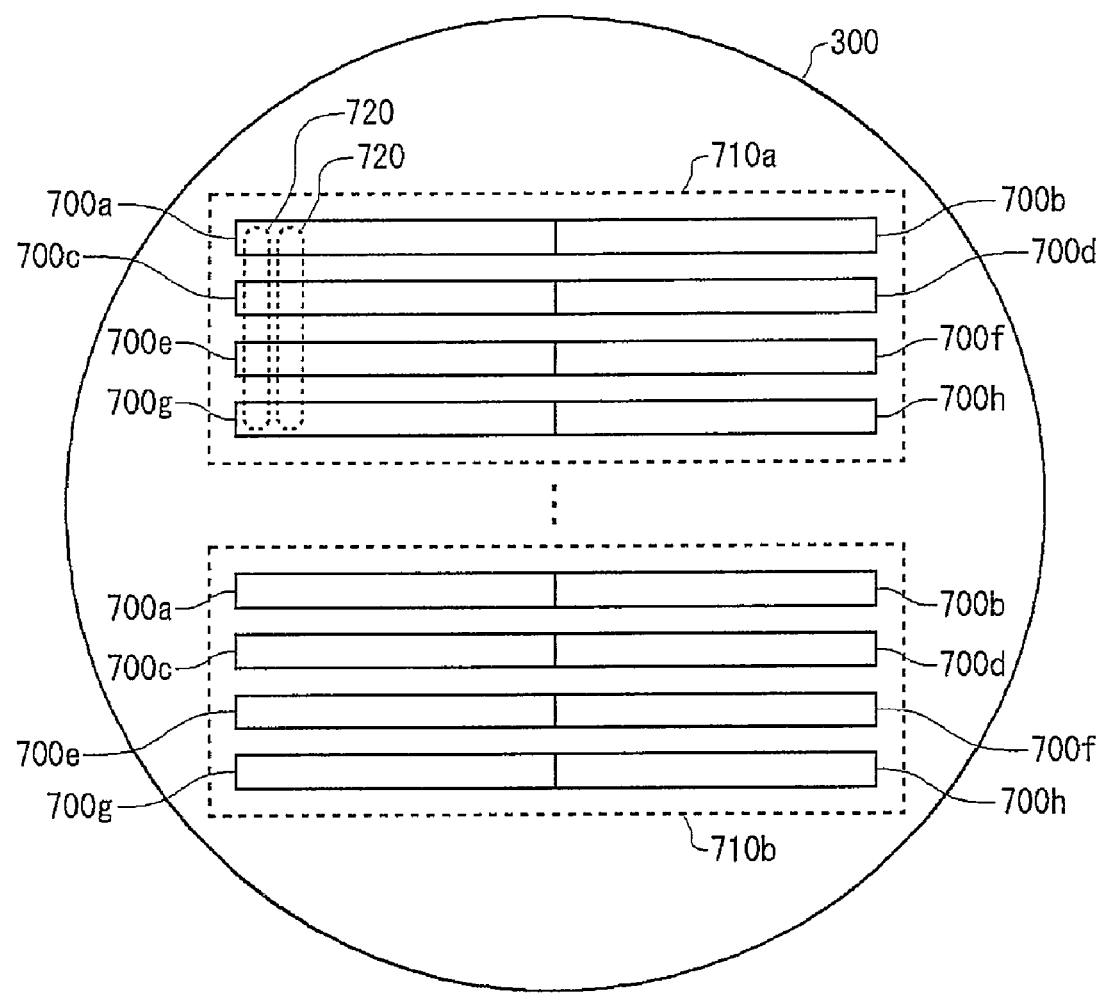
FIG. 7 shows a configuration of a connection portion of a test head 300 with an MB portion 320, according to an embodiment of the present invention.

FIG. 7 shows a configuration of a connection portion of a test head 300 with an MB portion 320, according to the present embodiment. In the present embodiment, the substrate of each test module 120 included in a test apparatus 10 is inserted to the test head 300, so that the connectors 700 arranged along the side of the upper surface of each substrate are aligned in a lattice formation when viewed from above the test head 300. Then, in correspondence with each group 710, test modules 120, in a predetermined number in both the row and column directions, are allocated on the upper surface of the test head 300. As one example, in the case of FIG. 7, corresponding to each group 710*a-b*, eight test modules 120 of four rows and two columns are allocated.

The test apparatus 10 according to the present embodiment has a high degree of freedom in connecting a plurality of test modules 120 and a plurality of DUTs 100, and is able to connect two or more test modules 120 to the same DUT 100. Wiring of each connection point to be connected to the same DUT 100 is performed so that each connection point is concentrated to be positioned near above the test heard 300, thereby optimizing the connection between the test modules 120 and the DUTs 100. Specifically, for example, a set of connection points in the same column range of a connector 700a, a connector 700c, a connector 700e, and a connector 700g aligned in the row direction may be set as a device corresponding portion 720 to be connected to the same DUT 100.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

According to an aspect of the present invention, it becomes possible to perform a test by connecting two or more test modules 120 to the same DUT 100, and so a set of connection points of a plurality of connectors 700 may be connected to the same DUT 100, as a device corresponding portion 720. Accordingly, it becomes possible to realize a test apparatus and a test method enabling to perform physical positioning of wiring between the test modules 120 and the DUTs 100 more adequately.

What is claimed is:

1. A test apparatus for testing a plurality of memories under test, the test apparatus comprising:
    a plurality of test signal supply sections, each of which is connected to a corresponding terminal of a corresponding one of the memories under test, and supplies a test signal for writing test data to the memory under test being the connection destination, to the terminal;
    a plurality of terminal correspondence determination sections, each of which is connected to a corresponding terminal of a corresponding one of the memories under test, and outputs a terminal unit determination result indicating whether test data read from the terminal being the connection destination matches an expected value;
    a determination-side connection information memorizing section that memorizes determination-side connection information that associates each of the terminal correspondence determination sections to a corresponding one of the memories under test that is the connection destination; and
    a determination result treatment section that determines whether writing to each of the memories under test succeeded based on a plurality of terminal unit determination results collected from the plurality of terminal correspondence determination sections and the determination-side connection information, and causes the plurality of test signal supply sections to re-test memories under test to which writing failed, the determination result treatment section comprising a determination result selection section that selects, for each memory under test, the plurality of terminal unit determination results outputted from the plurality of terminal correspondence determination sections and rearranges the selected terminal unit determination results in the order of a plurality of terminals of the plurality of memories under test, based on the determination-side connection information.

2. The test apparatus as set forth in claim 1, further comprising:
    a supply-side connection information memorizing section that memorizes supply-side connection information associating each of the memories under test to a test signal supply section to which the memory under test is connected, wherein
    the determination result treatment section further comprises:
        memory correspondence determination section that determines whether writing succeeded for each memory under test, based on the selection result of the determination result selection section;
        an identifying section that identifies a test signal supply section connected to a memory under test to which writing succeeded and a test signal supply section connected to a memory under test to which writing failed, based on the supply-side connection information; and
        a mask treatment section that instructs the test signal supply section connected to the memory under test to which writing failed, to supply a test signal for writing test data again to the memory under test, while prohibiting the test signal supply section connected to the memory under test to which writing succeeded, from supplying a test signal for writing test data again to the memory under test.

3. The test apparatus as set forth in claim 2, wherein
    the determination-side connection information memorizing section memorizes the determination-side connection information for associating each of the terminal correspondence determination sections to the connected terminal of the memory under test being the connection destination, and
    the memory correspondence determination section determines, for each memory under test, whether writing to the memory under test succeeded, based on the terminal unit determination results having been rearranged.

4. The test apparatus as set forth in claim 3, wherein
    the supply-side connection information memorizing section memorizes the supply-side connection information associating each of the terminals of each of the memories under test to the test signal supply section connected to the terminal,
    the memory correspondence determination section converts, for each memory under test, the plurality of terminal unit determination results into a plurality of pieces of writing successful/unsuccessful information corresponding to the plurality of terminals, by converting all the terminal unit determination results for the memory under test into a determination result indicating non-matching, when any of the terminal unit determination results having been rearranged indicates non-matching, and
    the identifying section associates the plurality of pieces of writing successful/unsuccessful information corresponding to the plurality of terminals, with the plurality of test signal supply sections, by rearranging the plurality of pieces of writing successful/unsuccessful information in the order corresponding to the plurality of test signal supply sections, based on the supply-side connection information.

5. The test apparatus as set forth in claim 4, wherein
    each group resulting from dividing the plurality of memories under test into two or more memories under test includes two or more test signal supply sections, two or more terminal correspondence determination sections, the supply-side connection information memorizing section, the determination-side connection information memorizing section, the determination result selection section, the memory correspondence determination section, the identifying section, and the mask treatment section, and the test apparatus further comprises:
- a device interface section that connects each of the plurality of memories under test to the two or more test signal supply sections and the two or more terminal correspondence determination sections associated with a group to which the memory under test belongs to.

6. The test apparatus as set forth in claim 4, further comprising, for each of the test signal supply sections:
- a connection destination register that memorizes memory identification information identifying the memory under test connected to the test signal supply section, and terminal identification information identifying the terminal of the memory under test being the connection destination; and
- a command execution section that, when receiving a command broadcasted by a control apparatus of the test apparatus to the plurality of test signal supply sections, executes the command, on condition that memory identification information and terminal identification information designated by the command match the memory identification information and the terminal identification information memorized in the connection destination register.

7. The test apparatus as set forth in claim 2, wherein
the mask treatment section prohibits the test signal supply section connected to the memory under test to which writing succeeded, from supplying a test signal for writing test data again to the memory under test, and prohibits the terminal correspondence determination section connected to the memory under test, from performing matching determination between data read from the terminal being the connection destination and an expected value, and the mask treatment section instructs the test signal supply section connected to the memory under test to which writing failed, to supply a test signal for writing test data again to the memory under test, and instructs the terminal correspondence determination section connected to the memory under test, to perform matching determination between data read from the terminal being the connection destination and an expected value.

8. The test apparatus as set forth in claim 1, wherein
the plurality of test signal supply sections and the plurality of terminal correspondence determination sections are mounted by being divided into a plurality of test modules each of which includes two or more test signal supply sections and two or more terminal correspondence determination sections, and the test apparatus further comprises:
- a socket board that electrically connects a plurality of sockets to which the devices under test are mounted respectively, with a plurality of first connectors, via wiring on a substrate; and
- a mother board section to which the socket board is mounted, the mother board electrically connecting a plurality of second connectors to which the plurality of first connectors are connected, with the plurality of test modules, by means of a cable.

9. The test apparatus as set forth in claim 8, wherein
the mother board section is used common to tests of the devices under test of a plurality of kinds which differ in terminal arrays from each other, the socket board is exchanged according to the types of the devices under test, and the test apparatus further comprises:
- a control apparatus that writes, to the determination-side connection information memorizing section, the determination-side connection information that associates each of the terminal correspondence determination sections to the memory under test connected to the terminal correspondence determination section by the socket board and the mother board section, when the socket board is exchanged.

10. The test apparatus as set forth in claim 9, wherein
the control apparatus writes, to the determination-side connection information memorizing section, the determination-side connection information that associates the two or more terminal correspondence determination sections included in different test modules, to the same memory under test to which the two or more terminal correspondence determination sections are connected by the socket board and the mother board section that are after the exchange.

11. A test method for testing a plurality of memories under test, the test method comprising:
- supplying a test signal for writing test data to the memories under test, to a terminal of one of the memories under test,
- outputting a terminal unit determination result indicating whether test data read from a terminal of one of the memories under test matches an expected value;
- memorizing determination-side connection information that associates each of a plurality of members outputting the terminal unit determination result, to a memory under test being the connection destination; and
- collecting the terminal unit determination results from the plurality of members outputting the terminal unit determination results, selecting, for each memory under test, the plurality of terminal unit determination results outputted from the plurality of members outputting the terminal unit determination results, rearranging the selected terminal unit determination results in the order corresponding to the plurality of terminals of the plurality of memories under test, based on the determination-side connection information, determining whether writing to each of the memories under test succeeded, and re-testing memories under test to which writing failed.

12. The test method as set forth in claim 11, further comprising:
- memorizing supply-side connection information associating each of the memories under test to a member connected to the memory under test and supplying a test signal;
- determining whether writing succeeded for each of the memories under test, based on the selection result;
- identifying a member connected to a memory under test to which writing succeeded and supplying the test signal, and a member connected to a memory under test to which writing failed and supplying the test signal, based on the supply-side connection information; and
- instructing the member connected to the memory under test to which writing failed and supplying the test signal, to supply a test signal for writing test data again to the memory under test, while prohibiting the member connected to a memory under test to which writing succeeded and supplying the test signal, from supplying a test signal for writing test data again to the memory under test.

13. The test method as set forth in claim 12, further comprising:
- memorizing the determination-side connection information associating a member outputting each of the terminal unit determination results, to the connected terminal of the memory under test being the connection destination; and
- determining, for each memory under test, whether writing to the memory under test succeeded, based on the terminal unit determination results having been rearranged.

14. The test method as set forth in claim 13, further comprising:
- memorizing the supply-side connection information associating each of the terminals of each of the memories under test to a member connected to the terminal and supplying the test signal;
- converting, for each memory under test, the plurality of terminal unit determination results into a plurality of pieces of writing successful/unsuccessful information corresponding to the plurality of terminals, by converting all the terminal unit determination results for the memory under test into a determination result indicating non-matching, when any of the terminal unit determination results having been rearranged indicates non-matching; and
- associating the plurality of pieces of writing successful/unsuccessful information corresponding to the plurality of terminals, with members supplying the test signals, by rearranging the plurality of pieces of writing successful/unsuccessful information in the order corresponding to the members supplying the test signals.

15. The test method as set forth in claim 14, further comprising, for each of the members supplying the test signals:
- memorizing memory identification information identifying the memory under test connected to a member supplying the test signal, and terminal identification information identifying the terminal of the memory under test being the connection destination; and
- when receiving a command broadcasted by a control apparatus of a test apparatus to the members supplying the test signals, executing the command, on condition that memory identification information and terminal identification information designated by the command match the memory identification information and the terminal identification information.

16. The test method as set forth in claim 12, further comprising:
- prohibiting the member connected to the memory under test to which writing succeeded and supplying the test signal, from supplying a test signal for writing test data again to the memory under test, and prohibiting the member connected to the memory under test and outputting the terminal unit determination result, from performing matching determination between data read from the terminal being the connection destination and an expected value; and
- instructing the member connected to the memory under test to which writing failed and supplying the test signal, to supply a test signal for writing test data again to the memory under test, and instructing the member connected to the memory under test and outputting the terminal unit determination result, to perform matching determination between data read from the terminal being the connection destination and an expected value.

* * * * *